(12) United States Patent
Ikeda et al.

(10) Patent No.: US 9,577,182 B2
(45) Date of Patent: Feb. 21, 2017

(54) MAGNETORESISTANCE EFFECT ELEMENT AND MAGNETIC MEMORY

(71) Applicant: TOHOKU UNIVERSITY, Sendai-shi, Miyagi (JP)

(72) Inventors: Shoji Ikeda, Sendai (JP); Hideo Sato, Sendai (JP); Shunsuke Fukami, Sendai (JP); Michihiko Yamanouchi, Sendai (JP); Fumihiro Matsukura, Sendai (JP); Hideo Ohno, Sendai (JP); Shinya Ishikawa, Sendai (JP)

(73) Assignee: TOHOKU UNIVERSITY, Sendai-shi (JP)

( * ) Notice: Subject to any disclaimer, the term of this patent is extended or adjusted under 35 U.S.C. 154(b) by 0 days.

(21) Appl. No.: 15/029,860

(22) PCT Filed: Oct. 20, 2014

(86) PCT No.: PCT/JP2014/077816
§ 371 (c)(1),
(2) Date: Apr. 15, 2016

(87) PCT Pub. No.: WO2015/060239
PCT Pub. Date: Apr. 30, 2015

(65) Prior Publication Data
US 2016/0233416 A1    Aug. 11, 2016

(30) Foreign Application Priority Data
Oct. 22, 2013   (JP) .................................. 2013-219675

(51) Int. Cl.
*H01L 43/08* (2006.01)
*G11C 11/16* (2006.01)
(Continued)

(52) U.S. Cl.
CPC ............. *H01L 43/08* (2013.01); *G11C 11/161* (2013.01); *H01L 43/02* (2013.01); *H01L 27/228* (2013.01)

(58) Field of Classification Search
CPC ..................... H01L 43/02; H01L 43/08; G11C 11/14–11/16; G11C 11/161
See application file for complete search history.

(56) References Cited

U.S. PATENT DOCUMENTS 6,480,412 B1    11/2002   Bessho et al.
7,307,302 B2 *  12/2007   Saito ....................... G11C 11/16
                                                                257/295
(Continued)

FOREIGN PATENT DOCUMENTS

JP    H11-353867 A    12/1999
JP    2001-196661 A    7/2001
(Continued)

OTHER PUBLICATIONS

Nishimura, Naoki et al., "Magnetic Tunnel Junction Device with Perpendicular Magnetization Films for High-Density Magnetic Random Access Memory," Journal of Applied Physics, vol. 91, No. 8; (Apr. 15, 2002), pp. 5246-5249.
(Continued)

*Primary Examiner* — Allison P Bernstein
(74) *Attorney, Agent, or Firm* — Oliff PLC

(57) ABSTRACT

A magnetoresistance effect element and a magnetic memory having thermal stability expressed by a thermal stability factor of 70 or more even with a fine junction size. The magnetoresistance effect element includes a first magnetic layer of an invariable magnetization direction forming a reference layer, a second magnetic layer of a variable magnetization direction forming a recording layer, and a first non-magnetic layer disposed between the first and second magnetic layers in a thickness direction of the first and (Continued)

second magnetic layers. At least one of the first and second magnetic layers has the following relationship between D (nm) and t (nm): D<0.9t+13, where D is a junction size corresponding to the length of a longest straight line on an end surface perpendicular to the thickness direction, and t is a layer thickness. The junction size is 30 nm or less.

10 Claims, 13 Drawing Sheets

(51) Int. Cl.
*H01L 43/02* (2006.01)
*H01L 27/22* (2006.01)

(56) References Cited

U.S. PATENT DOCUMENTS

| 8,531,875 B2 * | 9/2013 | Yanagi | B82Y 25/00 257/421 |
| 2012/0236633 A1 | 9/2012 | Saida et al. | |

FOREIGN PATENT DOCUMENTS

| JP | 2011-258596 A | 12/2011 |
| JP | 2012-195485 A | 10/2012 |
| WO | 2009/107780 A1 | 9/2009 |

OTHER PUBLICATIONS

Kim, Gukcheon et al., "Tunneling Magnetoresistance of Magnetic Tunnel Junctions Using Perpendicular Magnetization L10-CoPt Electrodes," Applied Physics Letters, vol. 92, (2008), pp. 172502-1 to 172502-3.

Mizunuma, K. et al., "MgO Barrier-Perpendicular Magnetic Tunnel Junctions with CoFe/Pd Multilayers and Ferromagnetic Insertion Layers," Applied Physics Letters, vol. 95, (2009), pp. 232516-1 to 232516-3.

Ikeda, S. et al., "A Perpendicular-Anisotropy CoFeB-MgO Magnetic Tunnel Junction," Nature Materials, vol. 9, (Sep. 2010), pp. 721-724.

Sato, Hideo et al., "MgO/CoFeB/Ta/CoFeB/MgO Recording Structure in Magnetic Tunnel Junctions with perpendicular Easy Axis," IEEE Transactions on Magnetics, vol. 49, No. 7, (Jul. 2013), pp. 4437-4440.

Dec. 16, 2014 Search Report issued in International Patent Application No. PCT/JP2014/077816.

Jun. 18, 2015 International Preliminary Report on Patentability issued in International Patent Application No. PCT/JP2014/077816.

\* cited by examiner (a)

(b)

MAGNETORESISTANCE EFFECT ELEMENT AND MAGNETIC MEMORY

TECHNICAL FIELD

This invention relates to a magnetoresistance effect element and a magnetic memory.

BACKGROUND ART

As shown in FIG. 14, a magnetic memory cell 105 of a magnetic memory (magnetic random access memory: MRAM) with a conventional magnetoresistance effect element has a structure where a magnetoresistance effect element 110 and a selection transistor 109 are electrically connected in series. The selection transistor 109 has a source electrode electrically connected to a source line 102, a drain electrode electrically connected through the magnetoresistance effect element 110 to a bit line 104, and a gate electrode electrically connected to a word line 103. The magnetoresistance effect element 110 basically has a three-layer structure with a first ferromagnetic layer 111, a second ferromagnetic layer 112, and a non-magnetic layer 113 provided between the first and second ferromagnetic layers 111 and 112. The resistance value of the magnetoresistance effect element 110 is reduced if the respective magnetizations of the first and second ferromagnetic layers 111 and 112 are parallel and is increased if these magnetizations are antiparallel. The memory cell of the MRAM assigns these two resistance conditions to bit information "0" and bit information "1".

In the MRAM, the magnetoresistance effect element 110 becomes finer and finer year by year for a higher integration. Both the first and second ferromagnetic layers 111 and 112 of the magnetoresistance effect element 110 are in the risk of thermal agitation of their magnetizations as these layers become finer, potentially leading to loss of bit information. To retain bit information even if the first and second ferromagnetic layers 111 and 112 become finer, the second ferromagnetic layer 112 to become a recording layer is required to have a thermal stability factor ($E/k_BT$) of 70 or more and the first ferromagnetic layer 111 to become a reference layer is required to have a thermal stability factor ($E/k_BT$) higher than that of the second ferromagnetic layer 112. Here, E is an energy barrier required for magnetization reversal and corresponding to the product of a magnetic anisotropy energy density $K_{eff}$ and a volume V of the first or second ferromagnetic layer 111 or 112 ($E=K_{eff}V$), $k_B$ is a Boltzmann's constant, and T is the absolute temperature.

To obtain high thermal stability expressed as $E/k_BT$, the effective magnetic anisotropy energy density $K_{eff}$ of the first or second ferromagnetic layers 111 or 112 should be increased. In terms of this aspect, a perpendicular magnetic anisotropy magnetoresistance effect element giving an easy axis of perpendicular magnetization to the first or second ferromagnetic layer 111 or 112 has received attention. Rare earth based amorphous alloys, $L1_0$-ordered element (Co or Fe)—Pt alloys, Co/(Pd or Pt) multilayer films, etc. have been studied as electrodes of such perpendicular magnetic anisotropy (see non-patent literature 1, 2, or 3, for example).

The present inventors have found that, in a stacked structure of CoFeB/MgO, reducing the thickness of the CoFeB layer generates perpendicular magnetic anisotropy (see patent literature 1, for example). By applying the stacked structure of CoFeB/MgO to a perpendicular magnetic anisotropy magnetoresistance effect element, $E/k_BT$ of substantially 40 is obtained in the second ferromagnetic layer 112 as a recording layer with a junction size diameter of 40 nm (see non-patent literature 4, for example). Further, by forming a double CoFeB—MgO interface recording layer structure and increasing the thickness of a magnetic layer in a recording layer with the purpose of enhancing thermal stability, $E/k_BT$ of 80 or more is obtained with the junction size diameter on the order of 40 nm and $E/k_BT$ of substantially 59 is obtained with the junction size diameter of 29 nm in the second ferromagnetic layer 112 as a recording layer (see non-patent literature 5, for example). The junction size of a ferromagnetic layer mentioned herein is the length of a longest straight line on a junction surface of the ferromagnetic layer at which the ferromagnetic layer contacts an adjacent non-magnetic layer or an adjacent electrode. According to non-patent literatures 4 and 5, the ferromagnetic layer has a circular columnar shape and the junction surface has a circular shape. Thus, the junction size means the diameter of the junction surface.

As shown in FIG. 15(a), a perpendicular magnetic anisotropy magnetoresistance effect element described in non-patent literature 4 has a basic structure where a lower non-magnetic electrode 114 and an upper non-magnetic electrode 115 are connected to a three-layer structure including a first ferromagnetic layer 111, a second ferromagnetic layer 112, and a non-magnetic layer 113 provided between the first and second ferromagnetic layers 111 and 112. As shown in FIG. 15(b), the second ferromagnetic layer 112 as a recording layer characteristically has a junction size D larger than a ferromagnetic layer thickness t.

As shown in FIG. 15(c), a perpendicular magnetic anisotropy magnetoresistance effect element described in non-patent literature 5 has a five-layer structure where a second non-magnetic layer 116 is stacked on a second ferromagnetic layer 112 on a non-magnetic layer 113, a third ferromagnetic layer 117 is stacked on the second non-magnetic layer 116, and a third non-magnetic layer 118 is stacked on the third ferromagnetic layer 117. Interface magnetic anisotropy is generated between the third ferromagnetic layer 117 and the third non-magnetic layer 118. Non-patent literature 5 recites that use of this five-layer structure can enhance thermal stability. This structure still has a characteristic in that a total thickness t of a recording layer including the second and third ferromagnetic layers 112 and 117 magnetically coupled through the second non-magnetic layer 116 is smaller than a junction size D.

CITATION LIST

Non-Patent Literatures

Non-Patent Literature 1: N. Nishimura, T. Hiral, A. Koganei, T. Ikeda, K. Okano, Y. Sekiguchi, and Y. Osada, "Magnetic tunnel joint device with perpendicular magnetization films for high-density magnetic random access memory", J. Appl. Phys. 2002, 91, 5246

Non-Patent Literature 2: G. Kim, Y. Sakuraba, M. Oogane, Y. Ando and T. Miyazaki, "Tunneling magnetoresistance of magnetic tunnel joints using perpendicular magnetization electrodes", Appl. Phys. Lett. 2008, 92, 172502

Non-Patent Literature 3: K. Mizunuma, S. Ikeda, J. H. Park, H. Yamamoto, H. D. Gan, K. Miura, H. Hasegawa, J. Hayakawa, F. Matsukura and H. Ohno, "MgO barrier-perpendicular magnetic tunnel joints with CoFe/Pd multilayers and ferromagnetic insertion layers", Appl. Phys. Lett. 2009, 95, 232516

Non-Patent Literature 4: S. Ikeda, K. Miura, H. Yamamoto, K. Mizunuma, H. D. Gan, M. Endo, S. Kanai, F. Matsukura, and H. Ohno, "A perpendicular-anisotropy CoFeB—MgO magnetic tunnel joint", Nature Mater., 2010, 9, 721

Non-Patent Literature 5: H. Sato, M. Yamanouchi, S. Ikeda, S. Fukami, F. Matsukura, and H. Ohno, "MgO/CoFeB/Ta/CoFeB/MgO recording structure in magnetic tunnel joints with perpendicular easy axis", IEEE Trans. Magn., 2013, 49, 4437

Patent Literature

Patent-Literature 1: Japanese Patent Application Publication No. 2011-258596

SUMMARY OF INVENTION

Technical Problems

To realize a large-capacity magnetic memory given an increased level of integration by increasing a degree of fineness, non-volatility to retain bit information for 10 years is required. This involves thermal stability expressed by a thermal stability factor of 70 or more in a ferromagnetic layer to become a recording layer. The perpendicular magnetic anisotropy magnetoresistance effect element described in non-patent literature 4 provides a thermal stability factor of about 40 with a junction diameter of 40 nm in the recording layer, meaning that the thermal stability factor does not exceed 70. The perpendicular magnetic anisotropy magnetoresistance effect element described in non-patent literature 5 provides a thermal stability factor of 80 or more with a junction diameter on the order of 40 nm in the recording layer. However, the thermal stability factor becomes about 59 with a junction diameter of 29 nm, meaning that the thermal stability factor does not exceed 70. Thus, there has been a problem in that thermal stability with a finer junction size should be enhanced further in order to realize a large-capacity magnetic memory given an increased level of integration by increasing a degree of fineness.

This invention has been made while attention is focused on this problem. This invention is intended to provide a magnetoresistance effect element and a magnetic memory having thermal stability expressed by a thermal stability factor of 70 or more even with a fine junction size.

Means of Solving Problem

To achieve high thermal stability of a magnetoresistance effect element, the present inventors made consideration based on the following principle. Specifically, regarding a thermal stability factor $E/k_B T$ of a ferromagnetic layer functioning as a recording layer to determine the performance of a magnetoresistance effect element to retain bit information, an energy barrier E is expressed by the product of a magnetic anisotropy energy density K and a volume V of the recording layer. In a coordinate system defining an x axis and a y axis in a plane and z axis in a plane-perpendicular direction perpendicular to this plane, the magnetic anisotropy energy density K is expressed by the following formula (1):

[Formula 1]

$$K = K_b - (N_z - N_x)\frac{M_S^2}{2\mu_o} + \frac{K_i}{t} \quad (1)$$

Where $K_b$ is a bulk magnetic anisotropy energy density resulting from crystal magnetic anisotropy or magnetoelastic effect, $N_z$ and $N_x$ are demagnetizing factors of the z axis and the x axis respectively, $M_S$ is saturation magnetization of the recording layer, $\mu_o$ is magnetic permeability of vacuum, $K_i$ is an interface magnetic anisotropy energy density, and t is the layer thickness of the recording layer. Here, $N_x$ is regarded as being equal to a demagnetizing factor $N_y$ of the y axis. Further, if K is a positive sign, an easy axis of magnetization is formed in a direction perpendicular to a plane.

The demagnetizing factors $N_z$ and $N_x$ have the following relationships:

if $D > t, (N_z - N_x) > 0$; and if $D < t, (N_z - N_x) < 0$.

It is found from these relationships and the formula (1) that making the junction size D larger than the layer thickness t of the recording layer can increase the value of K, thereby enhancing thermal stability. This is considered to result from the fact that making t larger than D helps magnetization point in a direction perpendicular to a junction surface by means of magnetic shape anisotropy. By contrast, in a conventional magnetoresistance effect element such as those described in non-patent literatures 4 and 5 shown in FIG. 15, the layer thickness t of a ferromagnetic layer as a recording layer is smaller than the junction size D (D>t). This makes a demagnetizing field exert effect in a direction in which perpendicularly pointing magnetization becomes unstable. This is considered to be a cause for reduction in thermal stability.

Based on an assumption that $K_b$ is zero, $K_i$ is 3 mJ/m², and $M_S$ is 1.45 T relative to that of CoFeB used in the magnetoresistance effect elements of non-patent literatures 4 and 5 in the formula (1), a thermal stability factor ($E/k_B T=KV/k_B T$) relative to the junction size D and the layer thickness t was calculated. FIG. 1(a) shows result of this calculation. As shown in FIG. 1(a), an in-plane easy axis is formed in a substantially entire range where D>0.9t+13. Thus, magnetization does not point in a direction perpendicular to a junction surface. By contrast, in a range where D<0.9t+13, the thermal stability factor $E/k_B T$ is found to increase as the layer thickness t becomes larger relative to the junction size D. In the range where D<0.9 t+13, a high thermal stability factor $E/k_B T$ can be obtained even if the junction size D is relatively small. For example, $E/k_B T$ of 70 nm or more can be obtained with D set at 30 nm and t at 20 nm or more. Comparison between the result of FIG. 1(a) and those about non-patent literatures 4 and 5 shows that, by setting D to be smaller than 0.9 t+13, a thermal stability factor higher than those of non-patent literatures 4 and 5 can be obtained even with a smaller junction size D. The range of FIG. 1(a) where D<0.9t+13 includes a range where $E/k_B T$ of 70 nm or more cannot be obtained. Even in this range, increasing $M_S$ of a ferromagnetic layer can still contribute to increase in the thermal stability factor $E/k_B T$.

FIG. 1(b) shows result of calculation of a thermal stability factor conducted based on an assumption that $K_b$ and $K_i$ are 0 mJ/m² and $M_S$ is 1.45 T in the formula (1). As shown in FIG. 1(b), an in-plane easy axis is formed in a range where D>t, whereas an axis of easy perpendicular magnetization is formed in a range where D<t. Comparison between this calculation result and that of FIG. 1(a) shows that, as the value of $K_i$ approaches zero, a border between the in-plane easy axis and the axis of easy perpendicular magnetization of FIG. 1(b) moves downwardly while sloping slightly steeply. The result of FIG. 1(b) can be used to conclude that, if the value of $K_i$ is not known or is considered to be close to zero, a high thermal stability factor can be obtained reliably by setting D to be smaller than t.

The present inventors have reached this invention based on the foregoing result of consideration.

Specifically, a magnetoresistance effect element according to this invention includes a first magnetic layer of a fixed magnetization direction that is either an upward direction or a downward direction in a thickness direction, a second magnetic layer of a variable magnetization direction that can be varied upwardly or downwardly in a thickness direction, and a first non-magnetic layer disposed between the first and second magnetic layers in a thickness direction of the first and second magnetic layers. The second magnetic layer has the following relationship between D (nm) and t (nm): D<0.9t+13, where D is a junction size corresponding to the length of a longest straight line on an end surface perpendicular to the thickness direction, and t is its layer thickness. In the magnetoresistance effect element according to this invention, the first magnetic layer may have also the following relationship: D<0.9t+13.

In the magnetoresistance effect element according to this invention, the first magnetic layer of a fixed magnetization direction functions as a reference layer and the second magnetic layer of a variable magnetization direction functions as a recording layer. In the magnetoresistance effect element according to this invention, at least one of the first and second magnetic layers has the relationship of D<0.9t+13, making it possible to enhance thermal stability. By determining a junction size and a layer thickness properly, thermal stability expressed by a thermal stability factor of 70 or more can be obtained. In particular, by forming the second magnetic layer functioning as the recording layer in such a manner that the second magnetic layer has the relationship of D<0.9t+13, excellent thermal stability is obtained.

Thermal stability expressed by a thermal stability factor of 70 or more may generally be obtained by a method of forming a magnetic layer using a material increased in $K_b$, or a material increased in $K_i$ resulting from thickness reduction of the magnetic layer. Such a material increased in $K_b$ or $K_i$ is known to have a high magnetic damping constant. According to a system of magnetization reversal through spin injection, a magnetic damping constant should be reduced in order to enhance thermal stability and to reduce a writing current for writing of bit information. This makes it difficult to reduce a writing current in a magnetoresistance effect element using a material having high $K_b$ or high $K_i$. By contrast, in the magnetoresistance effect element according to this invention, high thermal stability can be obtained by setting D to be smaller than 0.9t+13 without using a material having high $K_b$ or high $K_i$. This allows use of a magnetic layer of a low magnetic damping constant, thereby achieving reduction in a writing current.

In particular, in the magnetoresistance effect element according to this invention, in terms of a limitation on a current that can be caused to flow in a selection transistor, the first and/or second magnetic layers having the relationship of D<0.9t+13 preferably has a junction size of 30 nm or less in order to reduce a writing current while high thermal stability is maintained and a junction size is reduced. As seen from FIG. 1(a), the first and/or second magnetic layers having the relationship of D<0.9t+13 still preferably has a layer thickness of 10 nm or more in order to obtain thermal stability expressed by a thermal stability factor of 70 or more if a magnetic layer is made of CoFeB. Thermal stability can be enhanced by increasing $M_S$ of a ferromagnetic layer and a film thickness can be set at 10 nm or less while a junction size is reduced. In this way, in the magnetoresistance effect element according to this invention, even with a fine junction size of 30 nm or less, thermal stability expressed by a thermal stability factor of 70 or more can still be obtained.

In the magnetoresistance effect element according to this invention, if the value of $K_i$ is not known or is considered to be close to zero, the first and/or second magnetic layers preferably have a relationship of D<t. In this case, high thermal stability can be obtained reliably. In order to reduce a writing current while high thermal stability is maintained and a junction size is reduced, the first and/or second magnetic layers having the relationship of D<t preferably has a junction size of 30 nm or less. As seen from FIG. 1(b), the first and/or second magnetic layers having the relationship of D<t still preferably has a layer thickness of 20 nm or more in order to obtain thermal stability expressed by a thermal stability factor of 70 or more if a magnetic layer is made of CoFeB.

In the magnetoresistance effect element according to this invention, each of the first and second magnetic layers is preferably made of a material containing at least one 3 d ferromagnetic transition metal element such as Co, Fe, Ni, or Mn. The first non-magnetic layer is made of such a material including a compound containing oxygen such as MgO, $Al_2O_3$, $SiO_2$, TiO, or $Hf_2O$ as to generate a high magnetoresistance change ratio in combination with the material for the first and second magnetic layers.

In the magnetoresistance effect element according to this invention, a junction size is the length of a longest straight line on an end surface perpendicular to a thickness direction of a ferromagnetic layer, specifically, a junction plane of the ferromagnetic layer at which the ferromagnetic layer contacts an adjacent non-magnetic layer or an adjacent electrode. If the junction plane has the shape of a circle, the junction size means the diameter of the circle. If the junction plane has the shape of an ellipse, the junction size means the major axis of the ellipse. If the junction plane has the shape of a quadrilateral, the junction size means the longer diagonal of the quadrilateral.

The magnetoresistance effect element according to this invention may include a third magnetic layer of a fixed magnetization direction disposed between the first magnetic layer and the first non-magnetic layer, and a second non-magnetic layer disposed between the first and third magnetic layers. In this case, a high magnetoresistance change ratio can be obtained by controlling the second non-magnetic layer in thickness to such a degree that a part of the first magnetic layer and the third magnetic layer adjacent to the second non-magnetic layer are magnetically coupled and that the crystallinity of the first magnetic layer is not reflected in the second non-magnetic layer. The third magnetic layer is preferably made of a material containing at least one 3d ferromagnetic transition metal element such as Co, Fe, Ni, or Mn. The second non-magnetic layer may be made of a material containing any one of Ta, W, Hf, Zr, Nb, Mo, Ri, V, and Cr.

In the magnetoresistance effect element according to this invention, the first magnetic layer may have an antiparallel coupling stacked structure where two magnetic layers are coupled through a non-magnetic layer in such a manner that the respective magnetizations of the two magnetic layers become antiparallel to each other. This makes it possible to obtain high thermal stability without being affected by the magnetization direction of the second magnetic layer, compared to the case where the first magnetic layer only has one magnetization direction. The two magnetic layers in the first magnetic layer are preferably made of a material containing at least one 3 d ferromagnetic transition metal element such as Co, Fe, Ni, or Mn. Each of these two magnetic layers may alternatively be formed of an alloy film or a multilayer film having an axis of easy perpendicular magnetization. Still alternatively, each of these two magnetic layers may be formed of an alloy film or a multilayer film given an axis of easy perpendicular magnetization by means of magnetic shape anisotropy produced by setting an entire film thickness to be larger than a junction size. The non-magnetic layer in the first magnetic layer may be made of a material containing any one of Ru, Rh, Ir, Cr, and Cu.

In the magnetoresistance effect element according to this invention, the second magnetic layer may include a plurality of magnetic layers made of materials differing from each other. In this case, by setting the magnetization direction or the Curie temperature of each magnetic layer in the second magnetic layer properly, a writing current can be reduced by means of magnetization reversal through spin injection.

The magnetoresistance effect element according to this invention may include electric field application means provided in a manner that allows application of an electric field to a side surface of the second magnetic layer in the thickness direction. In this case, bit information can be written by a system of magnetization reversal through electric field induction without using a system of magnetization reversal through spin injection. This can make further contribution to reduction in power consumption than the case of using the system of magnetization reversal through spin injection.

A magnetic memory according to this invention includes: a plurality of source lines disposed parallel to each other; a plurality of word lines disposed parallel to each other in a direction crossing the source lines; a plurality of bit lines disposed parallel to the source lines; a selection transistor having a gate electrode electrically connected to the word line and a source electrode electrically connected to the source line; and the magnetoresistance effect element according to this invention disposed at a point where the bit line and the word line cross each other. In the magnetoresistance effect element, one of the first and second magnetic layers is electrically connected to a drain electrode of the selection transistor and the other of the first and second magnetic layers is electrically connected to the bit line. The magnetic memory is configured in a manner that allows application of a current to the magnetoresistance effect element in the thickness direction.

The magnetic memory according to this invention includes the magnetoresistance effect element according to this invention, so that the magnetic memory can obtain stability expressed by a thermal stability factor of 70 or more.

Advantageous Effects of Invention

This invention is capable of providing a magnetoresistance effect element and a magnetic memory having thermal stability expressed by a thermal stability factor of 70 or more even with a fine junction size.

DESCRIPTION OF EMBODIMENTS

An embodiment of this invention is described below based on the drawings.

Figure 1:
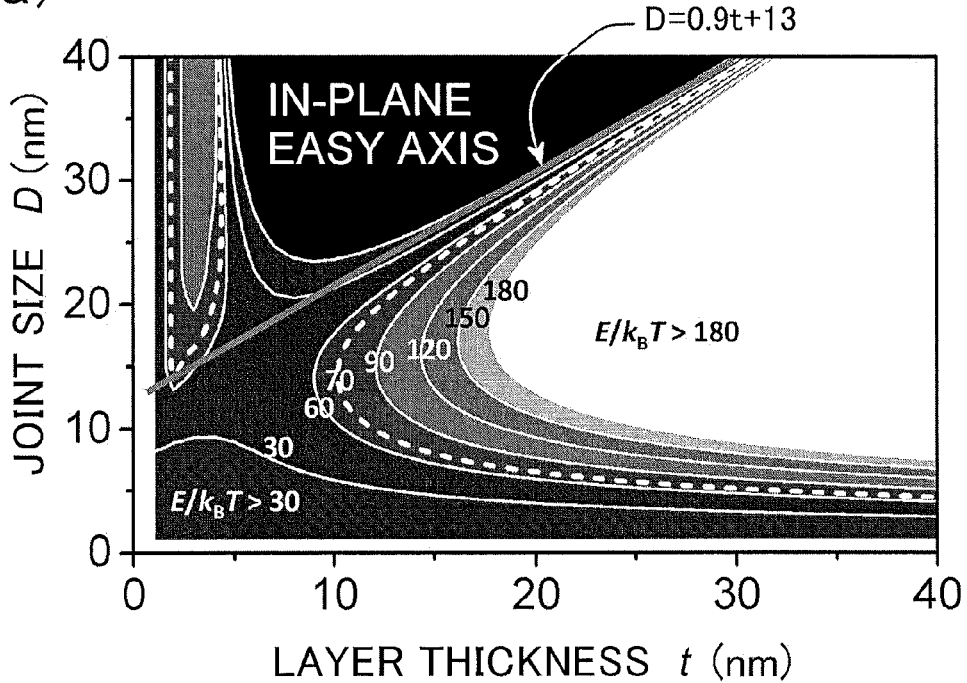
FIG. 1(a) is a graph showing result of calculation of a thermal stability factor ($E/k_BT$) relative to a junction size D and a layer thickness t about a ferromagnetic layer forming a recording layer of a magnetoresistance effect element conducted on an assumption that $K_i$ is 3 mJ/m$^2$.
FIG. 1(b) is a graph showing result of the same calculation conducted on an assumption that $K_i$ is 0 mJ/m$^2$.
Figure 1:
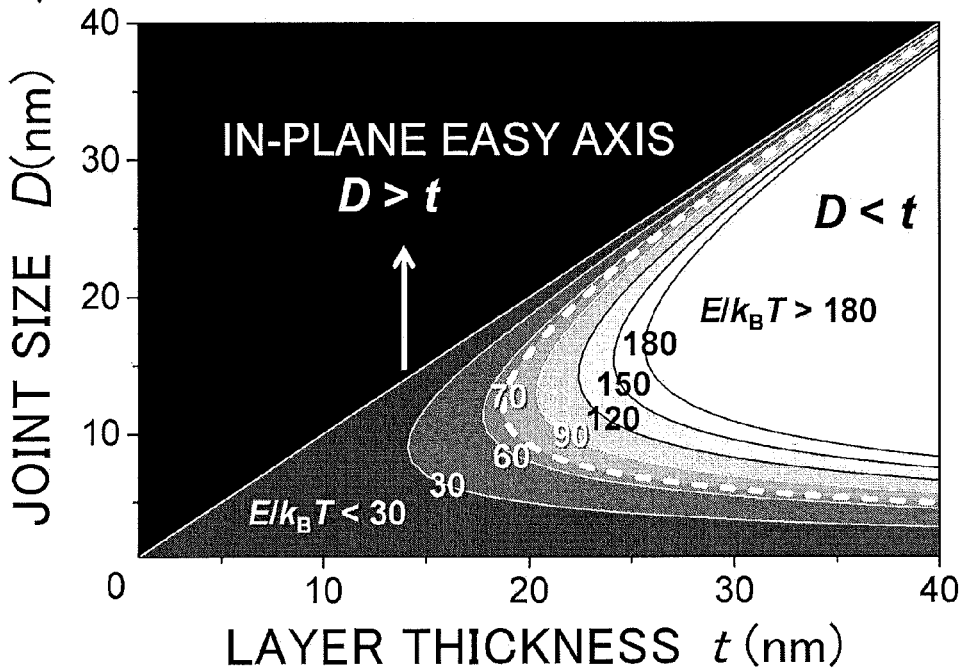
Figure 2:
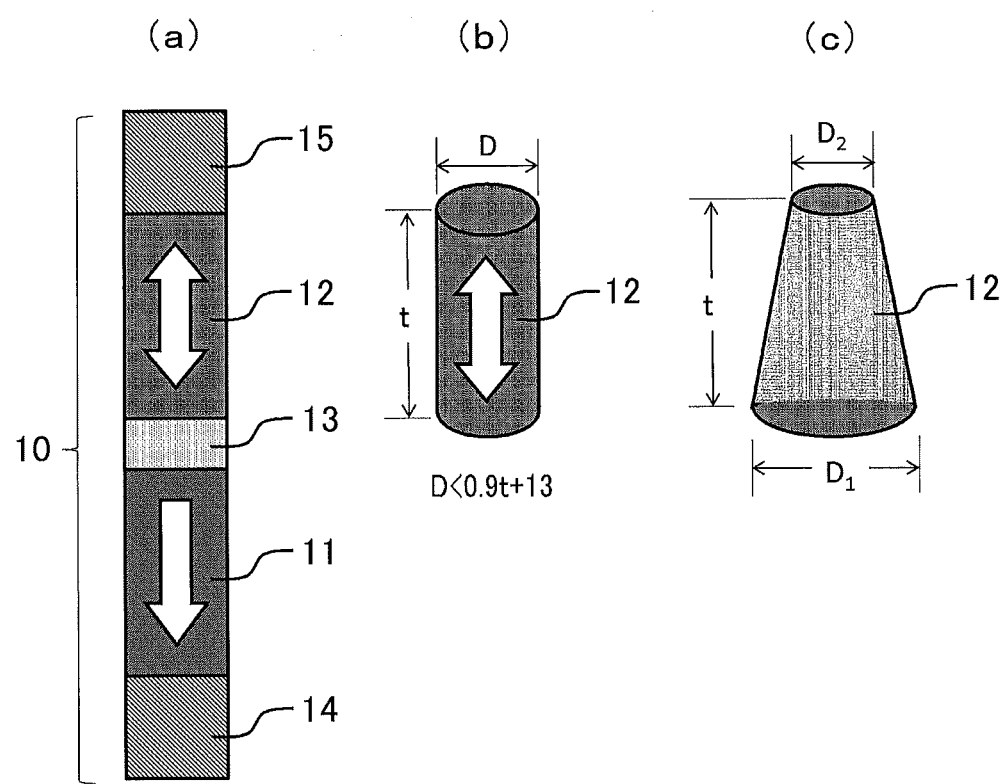
FIG. 2(a) is a longitudinal sectional view.
FIG. 2(b) is a perspective view of a second magnetic layer.
FIG. 2(c) is a perspective view of the second magnetic layer having different junction sizes at opposite end surfaces, all showing a magnetoresistance effect element according to an embodiment of this invention.

FIG. 2 shows a magnetoresistance effect element according to the embodiment of this invention.

As shown in FIG. 2(a), a magnetoresistance effect element 10 includes a first magnetic layer 11, a second magnetic layer 12, a first non-magnetic layer 13, a lower non-magnetic electrode 14, and an upper non-magnetic electrode 15.

The first magnetic layer 11 has a circular columnar shape, has an invariable magnetization direction that is either an upward direction or a downward direction in a thickness direction, and is configured to function as a reference layer. The first magnetic layer 11 is made of a material containing at least one 3 d ferromagnetic transition metal element such as Co, Fe, Ni, or Mn.

The second magnetic layer 12 has a circular columnar shape, has a magnetization direction that can be varied upwardly or downwardly in the thickness direction, and is configured to function as a recording layer. As shown in FIG. 2(b), the second magnetic layer 12 is formed in such a manner as to have the following relationship between a junction size D (nm) and a layer thickness t (nm): D<0.9t+13. The second magnetic layer 12 has the junction size D of 30 nm or less. The junction size D of the second magnetic layer 12 corresponds to the diameter of each of opposite circular end surfaces. The second magnetic layer 12 is made of a material containing at least one 3 d ferromagnetic transition metal element such as Co, Fe, Ni, or Mn.

As shown in FIG. 2(a), the first non-magnetic layer 13 has a circular columnar shape and is disposed between the first and second magnetic layers 11 and 12 in the thickness direction of the first and second magnetic layers 11 and 12. The first non-magnetic layer 13 has opposite end surfaces jointed to different ones of the first and second magnetic layers 11 and 12. The first non-magnetic layer 13 is made of such a material including a compound containing oxygen such as MgO, $Al_2O_3$, $SiO_2$, TiO, or $Hf_2O$ as to generate a high magnetoresistance change ratio in combination with the material for the first and second magnetic layers 11 and 12.

The lower non-magnetic electrode 14 is connected to an end surface of the first magnetic layer 11 opposite an end surface thereof to which the first non-magnetic layer 13 is connected. The upper non-magnetic electrode 15 is connected to an end surface of the second magnetic layer 12 opposite an end surface thereof to which the first non-magnetic layer 13 is connected.

Action is Described Next.

In the magnetoresistance effect element 10, the second magnetic layer 12 has the relationship of D<0.9t+13. Thus, magnetic shape anisotropy helps the magnetization of the second magnetic layer 12 point perpendicularly, so that thermal stability can be enhanced. In the magnetoresistance effect element 10, while D<0.9t+13 is established to achieve high thermal stability, a writing current for writing of bit information can be reduced by minimizing the junction size D. The junction size D of the second magnetic layer 12 is 30 nm or less, so that thermal stability expressed by a thermal stability factor of 70 or more can be obtained.

In the magnetoresistance effect element 10, the first magnetic layer 11 may also be formed in such a manner as to have the relationship of D<0.9t+13. This can enhance thermal stability further. As shown in FIG. 2(c), junction sizes at opposite end surfaces resulting from normal etching are $D_1$ and $D_2$ smaller than $D_1$, so that a junction size is not constant. In this case, a larger one of the respective diameters of the opposite end surfaces is defined as a junction size. The opposite end surfaces may not have circular shapes. In this case, the length of a longest straight line on each of the opposite end surfaces is defined as a junction size.

(First Modification)

Figure 3:
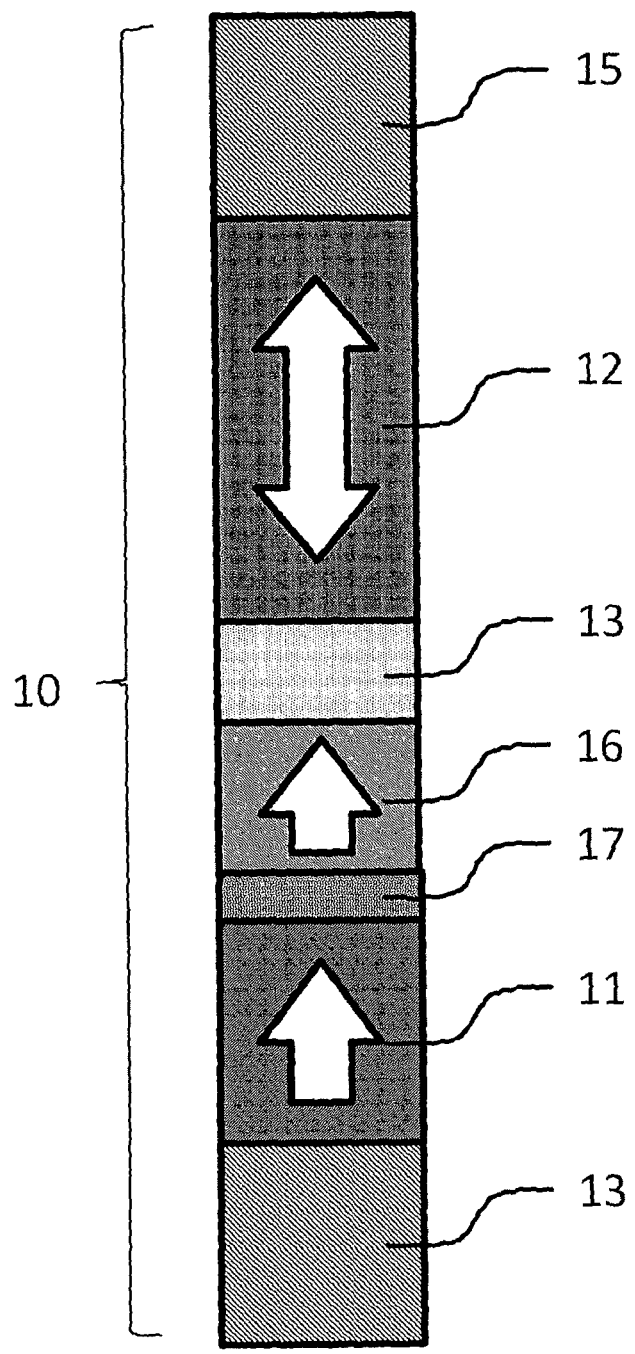
FIG. 3 is a longitudinal sectional view showing a first modification of the magnetoresistance effect element according to the embodiment of this invention.

FIG. 3 shows a first modification of the magnetoresistance effect element 10 according to the embodiment of this invention.

The first modification shown in FIG. 3 has the following structure intended to obtain a high magnetoresistance change ratio.

As shown in FIG. 3, the first modification includes a third magnetic layer 16 of an invariable magnetization direction disposed between the first magnetic layer 11 and the first non-magnetic layer 13, and a second non-magnetic layer 17 disposed between the first magnetic layer 11 and the third magnetic layer 16.

The third magnetic layer 16 has the same magnetization direction as the first magnetic layer 11. The third magnetic layer 16 is made of a material containing at least one 3 d ferromagnetic transition metal element such as Co, Fe, Ni, or Mn.

The second non-magnetic layer 17 is controlled in thickness to such a degree that the first and third magnetic layers 11 and 16 adjacent to the second non-magnetic layer 17 are magnetically coupled and that the crystallinity of the first magnetic layer 11 is not reflected in the second non-magnetic layer 17. The second non-magnetic layer 17 is made of a material containing any one of Ta, W, Hf, Zr, Nb, Mo, Ri, V, and Cr. However, the second non-magnetic layer 1 is not always required to be made of such materials as long as the first and third magnetic layers 11 and 16 are magnetically coupled. In the description of the structure of the first modification given here, the second non-magnetic layer 17 and the third magnetic layer 16 are stacked over the first magnetic layer 11. Meanwhile, the second non-magnetic layer 17 and the third magnetic layer 16 can be considered as being part of the first magnetic layer 11.

The following magnetoresistance effect element 10 was prepared in relation to the first modification and experiment was conducted to examine a relationship between an element resistance and a magnetic field.

Ta(5)/Pt(5)/[Co(0.3)/Pt(0.4)]$_{x20}$/Co(0.3)/Ta(0.4)/ $Co_{20}Fe_{60}B_{20}$(1)/MgO(1.0)/$Co_{20}Fe_{60}B_{20}$(20)/Ta(1)/Ru(5)/ Ta(50)

[Numerals in parentheses are layer thicknesses (in units of nanometers).]

In this structure, [Co(0.3)/Pt(0.4)]$_{x20}$/Co(0.3) corresponds to the first magnetic layer 11, Ta(0.4) to the second non-magnetic layer 17, $Co_{20}Fe_{60}B_{20}$(1) to the third magnetic layer 16, MgO (1.0) to the first non-magnetic layer 13, and $Co_{20}Fe_{60}B_{20}$(20) to the second magnetic layer 12. The second magnetic layer 12 has a layer thickness t of 20 nm.

Figure 4:
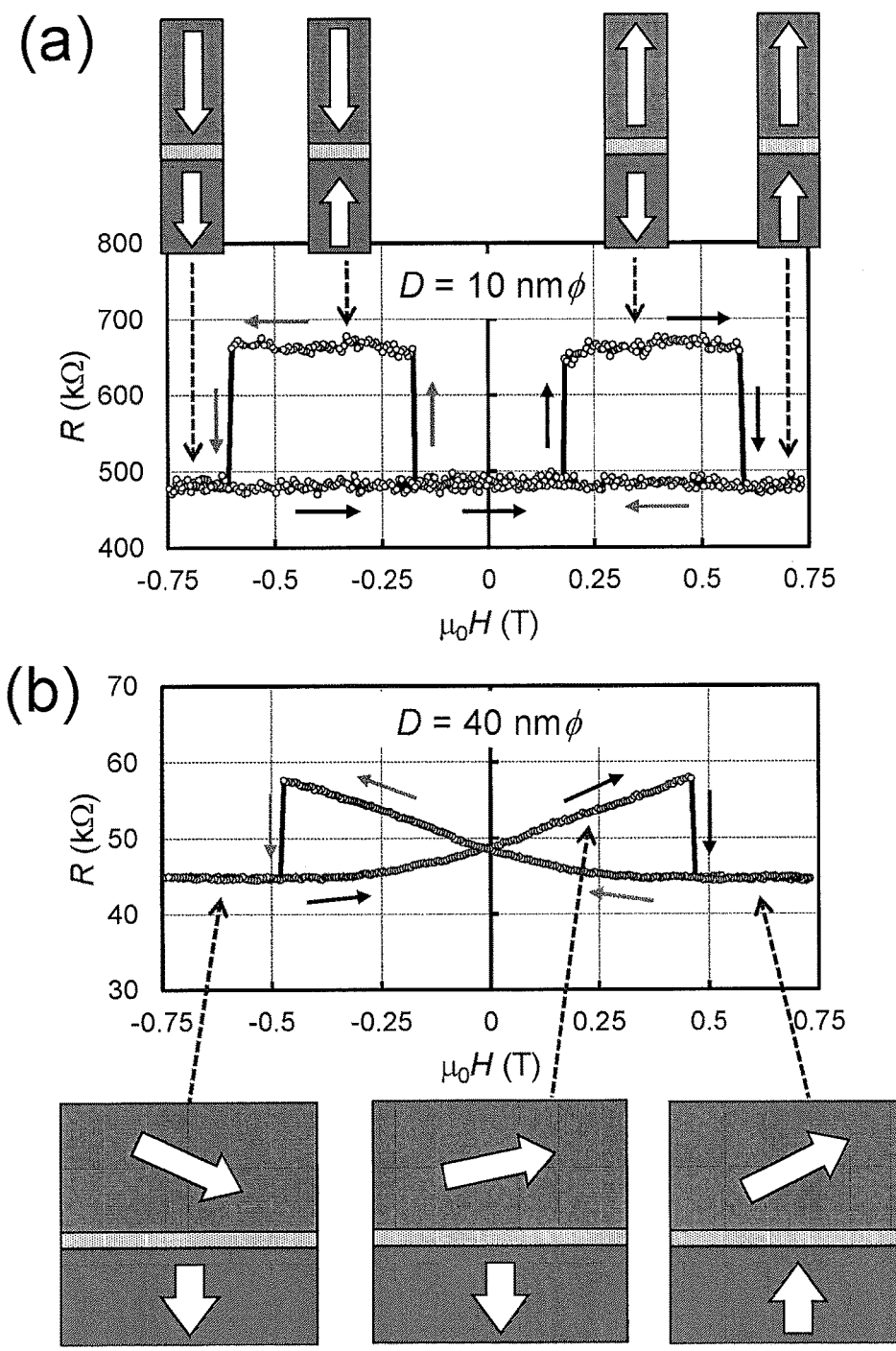
FIG. 4(a) is a graph showing a relationship between an element resistance and a plane-perpendicular magnetic field in the first modification of the magnetoresistance effect element shown in FIG. 3 determined while D=10 nm (D<0.9t+13 and D<t)
FIG. 4(b) is a graph showing the same relationship determined while D=40 nm (D>0.9t+13 and D>t).

The magnetoresistance effect element 10 having the junction size D of 10 nm (D<0.9t+13 and D<t) and the magnetoresistance effect element 10 having the junction size D of 40 nm (D>0.9t+13 and D>t) were prepared. Then, experiment was conducted by sweeping these magnetoresistance effect elements 10 at a plane-perpendicular magnetic field of plus or minus 0.75 T. An element resistance was measured by a DC four terminal method by applying a voltage of 10 mV. FIG. 4(a) shows a relationship between the element resistance (R) and the plane-perpendicular magnetic field ($\mu_0 H$) while D=10 nm. FIG. 4(b) shows the same relationship determined while D=40 nm. Arrows of FIG. 4 show directions of the sweeping at the plane-perpendicular magnetic field of plus or minus 0.75 T. Hollow arrows of FIG. 4 show the respective magnetization directions of the first and second magnetic layers 11 and 12.

As shown in FIG. 4(a), in the magnetoresistance effect element 10 where D is 10 nm, each of a recording layer and a reference layer has an axis of easy perpendicular magnetization. This is reflected in a curve of an element resistance and a plane-perpendicular magnetic field responsive to clear magnetic switching. By contrast, in the magnetoresistance effect element 10 where D is 40 nm, the magnetization of a CoFeB recording layer corresponding to the second magnetic layer 12 cannot point in a direction perpendicular to a plane, as shown in FIG. 4(b). Thus, resultant resistance change suggests that a gradient of the magnetization gradually changes relative to a plane-perpendicular magnetic field. Based on these results, setting a relationship between the layer thickness t and the junction size D about the second magnetic layer 12 as D<0.9t+13 was confirmed to produce the second magnetic layer 12 of magnetization pointing in a perpendicular direction. In this structure, a thermal stability factor was estimated based on a probability of magnetization reversal determined by a magnetic field pulse. As a result, the thermal stability factor of 70 or more is found to be obtained by setting the relationship between the layer thickness t and the junction size D about the second magnetic layer 12 as D<0.9t+13.

(Second Modification)

Figure 5:
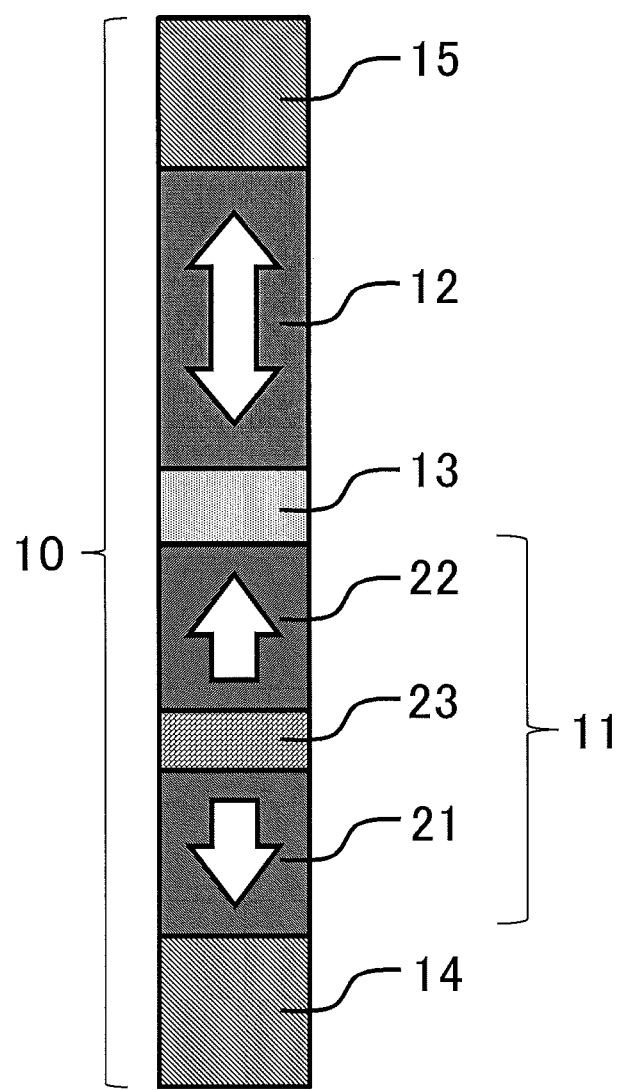
FIG. 5 is a longitudinal sectional view showing a second modification of the magnetoresistance effect element according to the embodiment of this invention.

FIG. 5 shows a second modification of the magnetoresistance effect element 10 according to the embodiment of this invention.

As shown in FIG. 5, in the second modification, the first magnetic layer 11 is formed of a first magnetic layer 21, a second magnetic layer 22, and a non-magnetic layer 23. The first magnetic layer 11 has an antiparallel coupling stacked structure where the first and second magnetic layers 21 and 22 are coupled through the non-magnetic layer 23 in such a manner that the respective magnetizations of the first and second magnetic layers 21 and 22 become antiparallel to each other in a thickness direction.

The first and second magnetic layers 21 and 22 are each made of a material containing at least one 3 d ferromagnetic transition metal element such as Co, Fe, Ni, or Mn. Alternatively, each of the first and second magnetic layers 21 and 22 may be formed of an alloy film or a multilayer film having an axis of easy perpendicular magnetization. Still alternatively, each of the first and second magnetic layers 21 and 22 may be formed of an alloy film or a multilayer film given an axis of easy perpendicular magnetization by means of magnetic shape anisotropy produced by uniformly setting a relationship between a film thickness t and a junction size D as D<0.9t+13.

The non-magnetic layer 23 is made of a material containing any one of Ru, Rh, Ir, Cr, and Cu. The non-magnetic layer 23 is not always required to be made of such materials as long as the respective magnetizations of the first and third magnetic layers 21 and 22 are antiparallel to each other.

If the magnetization of the first magnetic layer 11 is fixed in one direction in the thickness direction and if the respective magnetizations of the first and second magnetic layers 11 and 12 are arranged in an antiparallel configuration, a magnetic field from the first magnetic layer 11 acts to make the direction of the magnetization of the second magnetic layer unstable. This reduces thermal stability during the antiparallel configuration. By contrast, in the second modification shown in FIG. 5, by forming the first magnetic layer 11 into the antiparallel coupling stacked structure, the magnetic field from the first magnetic layer 11 can be weakened. This can enhance thermal stability while the respective magnetizations of the second magnetic layer 22 and the second magnetic layer 12 are antiparallel. In this way, the second modification can obtain higher thermal stability than that of the magnetoresistance effect elements 10 of FIGS. 2(a) and 3 without being affected by the magnetization direction of the second magnetic layer 12.

[Third Modification]

Figure 6:
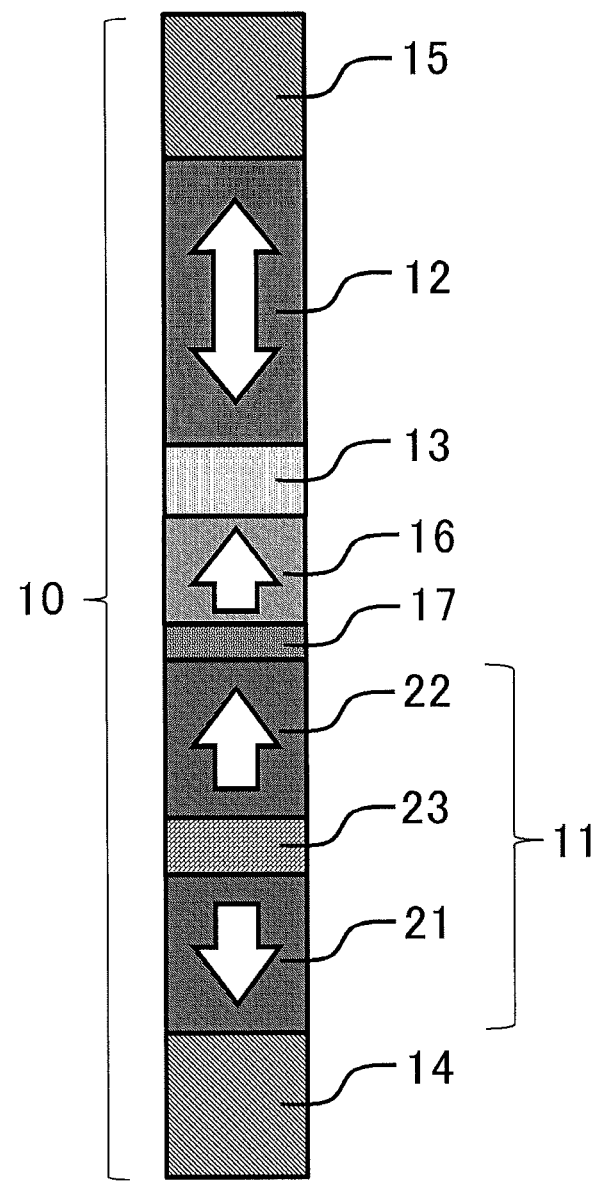
FIG. 6 is a longitudinal sectional view showing a third modification of the magnetoresistance effect element according to the embodiment of this invention.

FIG. 6 shows a third modification of the magnetoresistance effect element 10 according to the embodiment of this invention. The third modification shown in FIG. 6 has the following structure intended to obtain a higher magnetoresistance change ratio than that of the second modification.

As shown in FIG. 6, the third modification includes a third magnetic layer 16 of an invariable magnetization direction disposed between the first magnetic layer 11 of the second modification and the first non-magnetic layer 13, and a second non-magnetic layer 17 disposed between the first magnetic layer 11 and the third magnetic layer 16.

The third magnetic layer 16 has the same magnetization direction as the second magnetic layer 22 in the first magnetic layer 11. The third magnetic layer 16 is made of a material containing at least one 3 d ferromagnetic transition metal element such as Co, Fe, Ni, or Mn.

The second non-magnetic layer 17 is controlled in thickness to such a degree that the second magnetic layer 22 in the first magnetic layer 11 and the third magnetic layer 16 adjacent to the second non-magnetic layer 17 are magnetically coupled and that the crystallinity of the second magnetic layer 22 is not reflected in the second non-magnetic layer 17. The second non-magnetic layer 17 is made of a material containing any one of Ta, W, Hf, Zr, Nb, Mo, Ri, V, and Cr. However, the second non-magnetic layer 17 is not always required to be made of such materials as long as the second and third magnetic layers 22 and 16 are magnetically coupled. In the description of the structure of the third modification given here, the second non-magnetic layer 17 and the third magnetic layer 16 are stacked over the first magnetic layer 11. Meanwhile, the second non-magnetic layer 17 and the third magnetic layer 16 can be considered as being part of the first magnetic layer 11.

By using the same way as in the first example, experiment was conducted on the following structure using $Co_{20}Fe_{60}B_{20}(20)$ as the second magnetic layer 12 and including the first magnetic layer 11 changed to have an antiparallel coupling structure.

Substrate/Ta(5)/Pt(5)/[Co(0.3)/Pt(0.4)]$_{x6}$/Co(0.3)/Ru(0.4)/[Co(0.3)/Pt(0.4)]$_{x2}$/Co(0.3)/Ta(0.4)/Co$_{20}$Fe$_{60}$B$_{20}$(1)/MgO(1.0)/Co$_{20}$Fe$_{60}$B$_{20}$(20)/Ta(1)/Ru(5)/Ta(50)

[Numerals in Parentheses are Layer Thicknesses (in Units of Nanometers).]

In this structure, [Co(0.3)/Pt(0.4)]$_{x6}$/Co(0.3) corresponds to the first magnetic layer 21 in the first magnetic layer 11, Ru(0.4) to the non-magnetic layer 23, [Co(0.3)/Pt(0.4)]$_{x2}$/

Co(0.3) to the second magnetic layer 22, Ta(0.4) to the second non-magnetic layer 17, $Co_{20}Fe_{60}B_{20}(1)$ to the third magnetic layer 16, MgO(1.0) to the first non-magnetic layer 13, and $Co_{20}Fe_{60}B_{20}(20)$ to the second magnetic layer 12. As a result of the experiment, a curve of an element resistance and a magnetic field reflecting an axis of easy perpendicular magnetization comparable to that of FIG. 4 was obtained.

Result comparable to that of FIG. 4 was also obtained in a structure including $Co_{20}Fe_{50}(20)$ as the second magnetic layer 12 instead of $Co_{20}Fe_{60}B_{20}(20)$.

In these structures, a thermal stability factor was estimated based on a probability of magnetization reversal determined by a magnetic field pulse. As a result, the thermal stability factor of 70 or more is found to be obtained by setting the relationship between the layer thickness t and the junction size D about the second magnetic layer 12 as D<0.9t+13.

[Fourth Modification]

Figure 7:
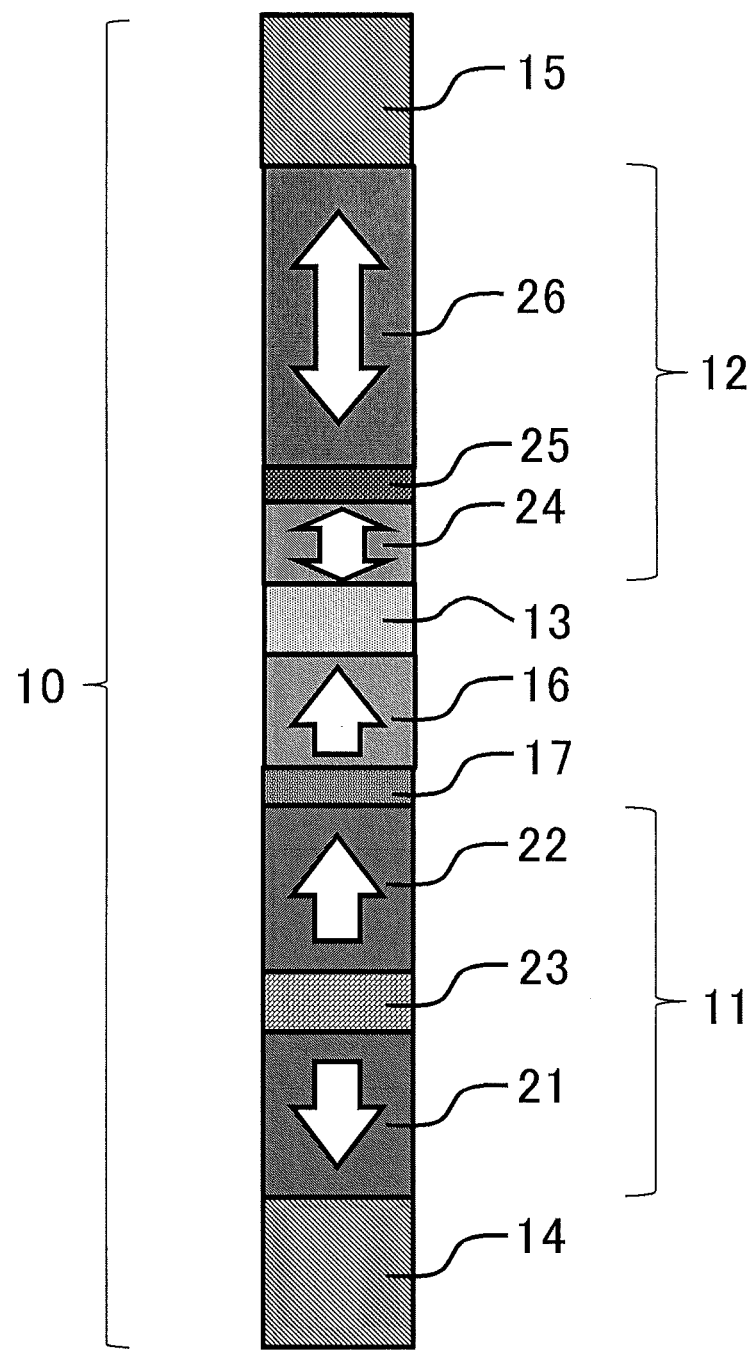
FIG. 7 is a longitudinal sectional view showing a fourth modification of the magnetoresistance effect element according to the embodiment of this invention.

FIG. 7 shows a fourth modification of the magnetoresistance effect element 10 according to the embodiment of this invention. The fourth modification shown in FIG. 7 has the following structure intended to obtain a higher magnetoresistance change ratio than that of the third modification.

As shown in FIG. 7, in the fourth modification, the second magnetic layer 12 is formed as a composite recording layer including a first magnetic layer 24, a non-magnetic layer 25, and a second magnetic layer 26 stacked in this order. The first and second magnetic layers 24 and 26 each have a magnetization direction that can be varied upwardly or downwardly in a thickness direction. The first and second magnetic layers 24 and 26 are each made of a material containing at least one 3 d ferromagnetic transition metal element such as Co, Fe, Ni, or Mn.

The non-magnetic layer 25 is controlled in thickness to such a degree that the first and second magnetic layers 24 and 26 adjacent to the non-magnetic layer 25 are kept coupled magnetically and that the crystallinity of the second magnetic layer 26 is not reflected in the non-magnetic layer 25. The non-magnetic layer 25 is made of a material containing any one of Ta, W, Hf, Zr, Nb, Mo, Ri, V, and Cr. However, the non-magnetic layer 25 is not always required to be made of such materials as long as the first and second magnetic layers 24 and 26 are magnetically coupled.

[Fifth Modification]

Figure 8:
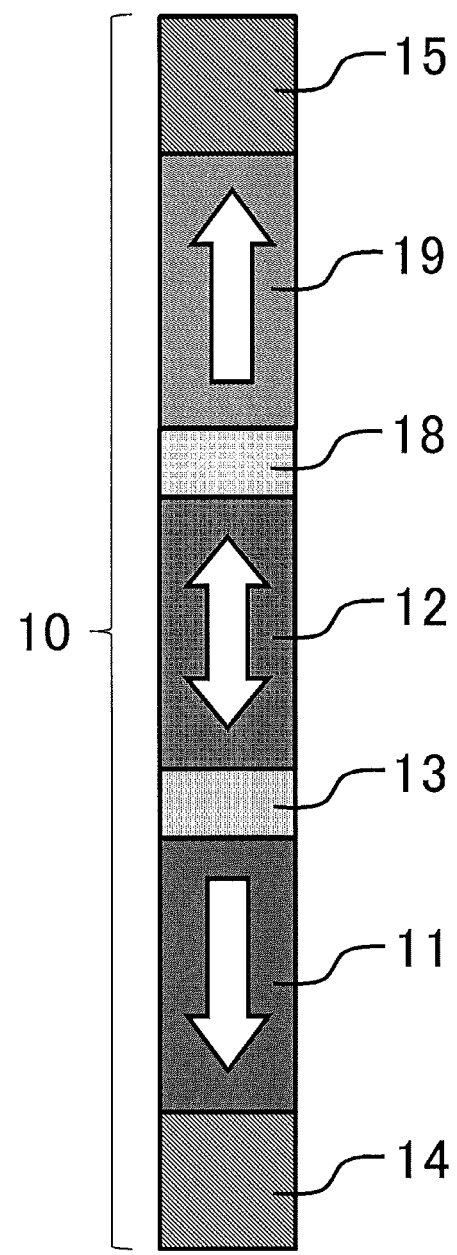
FIG. 8 is a longitudinal sectional view showing a fifth modification of the magnetoresistance effect element according to the embodiment of this invention.

FIG. 8 shows a fifth modification of the magnetoresistance effect element 10 according to the embodiment of this invention. The fifth modification shown in FIG. 8 has the following structure intended to reduce a current required for writing into a recording layer.

As shown in FIG. 8, the fifth modification has a structure where a third non-magnetic layer 18 and a fourth magnetic layer 19 magnetized in a direction opposite to the magnetization direction of the first magnetic layer 11 are stacked over the second magnetic layer 12. The third non-magnetic layer 18 is made of a compound containing oxygen such as MgO, $Al_2O_3$, $SiO_2$, TiO, or $Hf_2O$. The third non-magnetic layer 18 has a film thickness different from that of the first non-magnetic layer 13. The third non-magnetic layer 18 can be made of Cu, Ag, or Au, for example. The fourth magnetic layer 19 is made of a material containing at least one 3 d ferromagnetic transition metal element such as Co, Fe, Ni, or Mn. The fourth magnetic layer 19 has coercive force different from that of the first magnetic layer 11.

In the fifth modification, a large number of spins flowing from the first and fourth magnetic layers 11 and 19 as a lower reference layer and an upper reference layer act on the second magnetic layer 12 as a recording layer to generate a spin torque. In this way, a writing current can be reduced by means of magnetization reversal through spin injection.

In the fifth modification, if the first magnetic layer 11 has the antiparallel coupling stacked structure shown in FIG. 5 or 6, for example, the fourth magnetic layer 19 may have a structure stacked in reverse order to this antiparallel coupling stacked structure to arrange the respective magnetizations of the first and fourth magnetic layers 11 and 19 in opposite directions. Additionally, in the description of the structure of the fifth modification given here, the third non-magnetic layer 18 and the fourth magnetic layer 19 as a reference layer are stacked over the second magnetic layer 12. Meanwhile, the second magnetic layer 12 can be considered as having a stacked structure including a recording layer of a variable magnetization direction, the third non-magnetic layer 18, and the fourth magnetic layer 19 as a reference layer.

[Sixth Modification]

Figure 9:
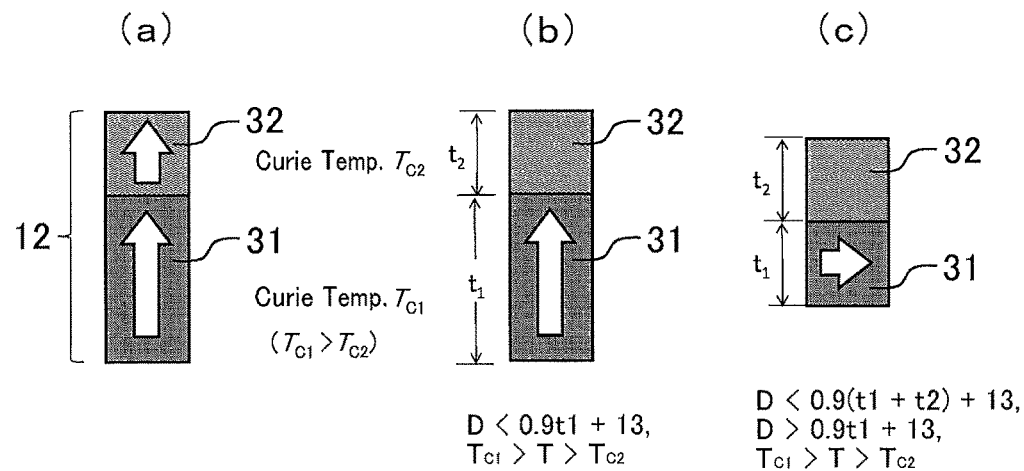
FIG. 9(a) is a longitudinal sectional view of a second magnetic layer.
FIG. 9(b) is a longitudinal sectional view of the second magnetic layer while the following relationships are established about D and a temperature T: D<0.9t$_1$+13 and T$_{C1}$>T>T$_{C2}$.
FIG. 9(c) is a longitudinal sectional view of the second magnetic layer while the following relationships are established about D and the temperature T: D<0.9(t$_1$+t$_2$)+13, D>0.9t$_1$+13, and T$_{C1}$>T>T$_{C2}$, all showing a sixth modification of the magnetoresistance effect element according to the embodiment of this invention.

FIG. 9 shows a sixth modification of the magnetoresistance effect element 10 according to the embodiment of this invention. The sixth modification shown in FIG. 9 has the following structure intended to reduce a current required for writing into a recording layer.

In the sixth modification, as shown in FIG. 9(a), the second magnetic layer 12 is formed of a lower magnetic layer 31 of a thickness $t_1$ and an upper magnetic layer 32 of a thickness $t_2$, and is configured in such a manner that the lower magnetic layer 31 has a Curie temperature $T_{C1}$ higher than a Curie temperature $T_{C2}$ of the upper magnetic layer 32.

In the sixth modification, as shown in FIG. 9(b), while the following relationships are established about D and a temperature T, the upper magnetic layer 32 exhibits paramagnetism and only the lower magnetic layer 31 is required to be reversed in magnetization: $D<0.9t_1+13$ and $T_{C1}>T>T_{C2}$. This reduces a total amount of moment, making it possible to realize magnetization reversal through spin injection with a low current. As shown in FIG. 9(c), while the following relationships are established about D and the temperature T, the upper magnetic layer 32 exhibits paramagnetism and the lower magnetic layer 31 does not receive contribution from magnetic shape anisotropy to make magnetization point in an in-plane direction: $D<0.9(t_1+t_2)+13$, $D>0.9t_1+13$, and $T_{C1}>T>T_{C2}$. Thus, only the lower magnetic layer 31 is required to be reversed in magnetization by 90 degrees. This structure still makes it possible to realize magnetization reversal through spin injection with a low current.

The second magnetic layer 12 as a recording layer may be formed of two or more magnetic layers. Further, a temperature may be increased by Joule heat resulting from a current flowing through a wiring line. In the example shown in FIG. 9, the Curie temperature differs between the lower and upper magnetic layers 31 and 32. More generally, the lower and upper magnetic layer 31 and 32 may differ in terms of a physical property different from the Curie temperature. For example, the lower magnetic layer 31 contacting the first non-magnetic layer 13 may be made of a material dedicated to increase resistance change produced by magnetoresistance effect. The upper magnetic layer 32 provided on the lower magnetic layer 31 may be made of a material dedicated to realize magnetization reversal through spin injection with a low current. More specifically, by using a Co—Fe—B alloy for the lower magnetic layer 31 and using Fe having a low damping constant for the upper magnetic layer 32, both favorable writing characteristics and favorable reading characteristics can be obtained.

[Seventh Modification]

Figure 10:
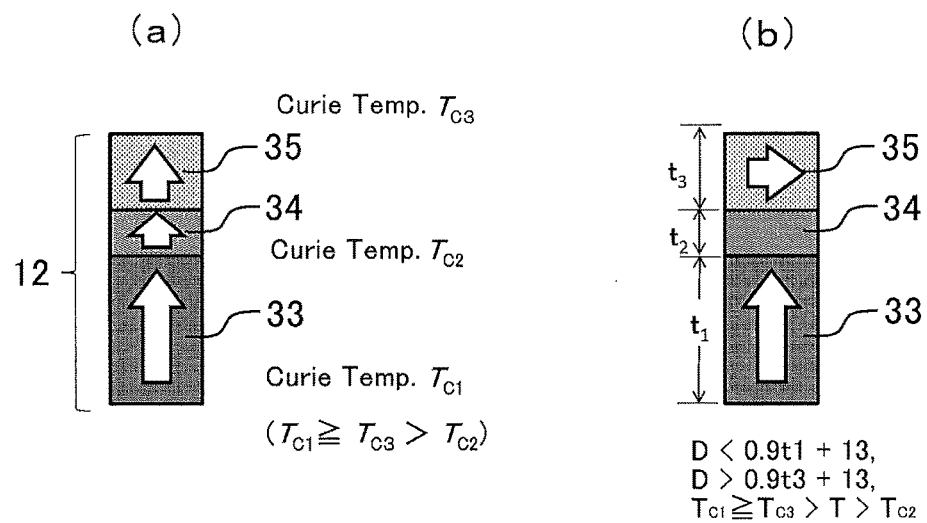
FIG. 10(a) is a longitudinal sectional view of a second magnetic layer and FIG. 10(b) is a longitudinal sectional view of the second magnetic layer while the following relationships are established about D and the temperature T: D<0.9t$_1$+13, D>0.9t$_3$+13, and T$_{C1}$≥T$_{C3}$>T>T$_{C2}$, both showing a seventh modification of the magnetoresistance effect element according to the embodiment of this invention.

FIG. 10 shows a seventh modification of the magnetoresistance effect element 10 according to the embodiment of this invention. The seventh modification shown in FIG. 10 has the following structure intended to reduce a current required for writing into a recording layer.

In the seventh modification, as shown in FIG. 10(a), the second magnetic layer 12 is formed of a lower magnetic layer 33 of a thickness $t_1$, an intermediate magnetic layer 34 of a thickness $t_2$, and an upper magnetic layer 35. The second magnetic layer 12 is configured in such a manner that the lower magnetic layer 33, the intermediate magnetic layer 34, and the upper magnetic layer 35 have a Curie temperature $T_{C1}$, a Curie temperature $T_{C2}$, and a Curie temperature $T_{C3}$ respectively that satisfy the following relationship: $T_{C1} \geq T_{C3} > T_{C2}$.

In the seventh modification, as shown in FIG. 10(b), while the following relationships are established about D and a temperature T, the intermediate magnetic layer 34 exhibits paramagnetism and the upper magnetic layer 35 becomes an in-plane magnetization polarized layer of magnetization pointing in an in-plane direction to act so as to assist in magnetization reversal of the lower magnetic layer 33: $D < 0.9t_1 + 13$, $D > 0.9t_3 + 13$, and $T_{C1} \geq T_{C3} > T > T_{C2}$. As a result, magnetization reversal through spin injection can be realized with a low current.

[Eighth Modification]

Figure 11:
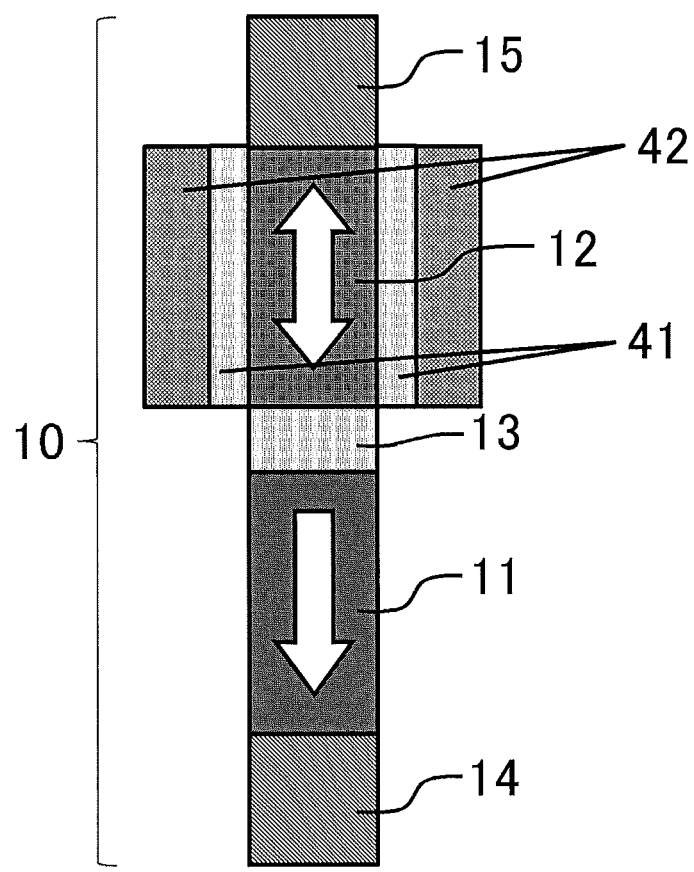
FIG. 11 is a longitudinal sectional view showing an eighth modification of the magnetoresistance effect element according to the embodiment of this invention.
Figure 12:
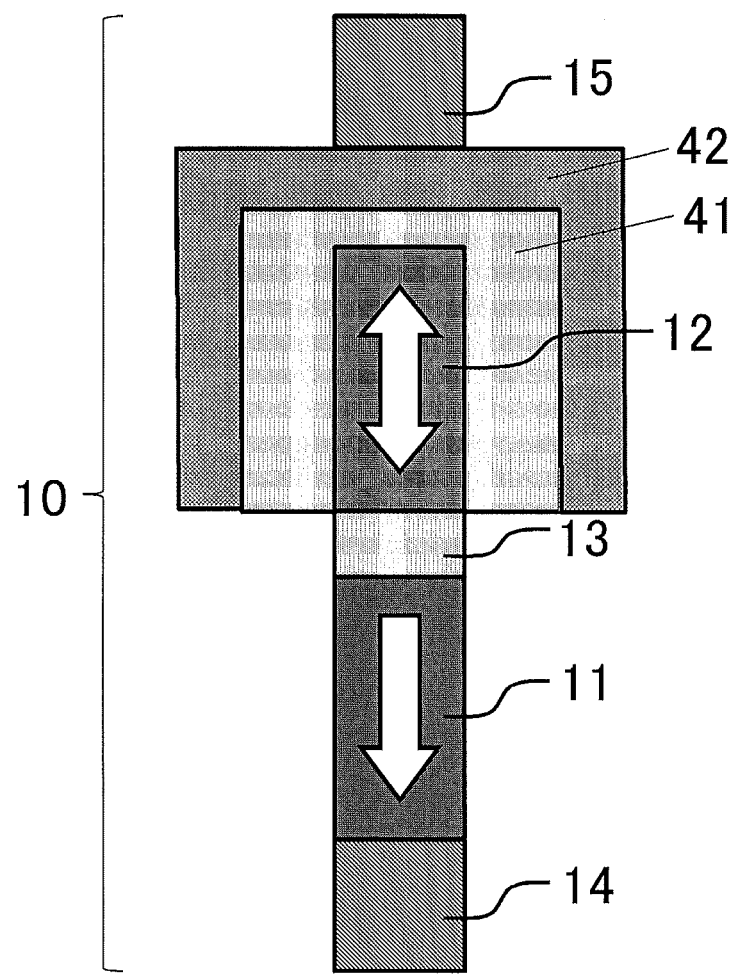
FIG. 12 is a longitudinal sectional view showing a different aspect of the eighth modification of the magnetoresistance effect element according to the embodiment of this invention.

FIGS. 11 and 12 show an eighth modification of the magnetoresistance effect element 10 according to the embodiment of this invention.

A system of magnetization reversal through electric field induction is expected to achieve further reduction in power consumption during writing than a system of magnetization reversal through spin injection. Thus, the eighth modification has a structure employing the system of magnetization reversal through electric field induction.

As shown in FIG. 11, the eighth modification includes an insulating layer 41 covering a side surface of the second magnetic layer 12 as a recording layer, and electric field application means 42 provided outside the insulating layer 41 in a manner that allows application of an electric field to a side surface of the second magnetic layer 12. A structure where the layer thickness t and the junction size D about the second magnetic layer 12 have the relationship of $D < 0.9t + 13$ increases the area of the side surface. Thus, applying an electric field to the recording layer using the electric field application means 42 can help magnetization reversal through electric field induction.

As shown in FIG. 12, the insulating layer 41 and the electric field application means 42 may be provided not only to the side surface but also to the upper surface of the second magnetic layer 12. This can help magnetization reversal through electric field induction further.

[Magnetic Memory 1 According to Embodiment of Invention]

Figure 13:
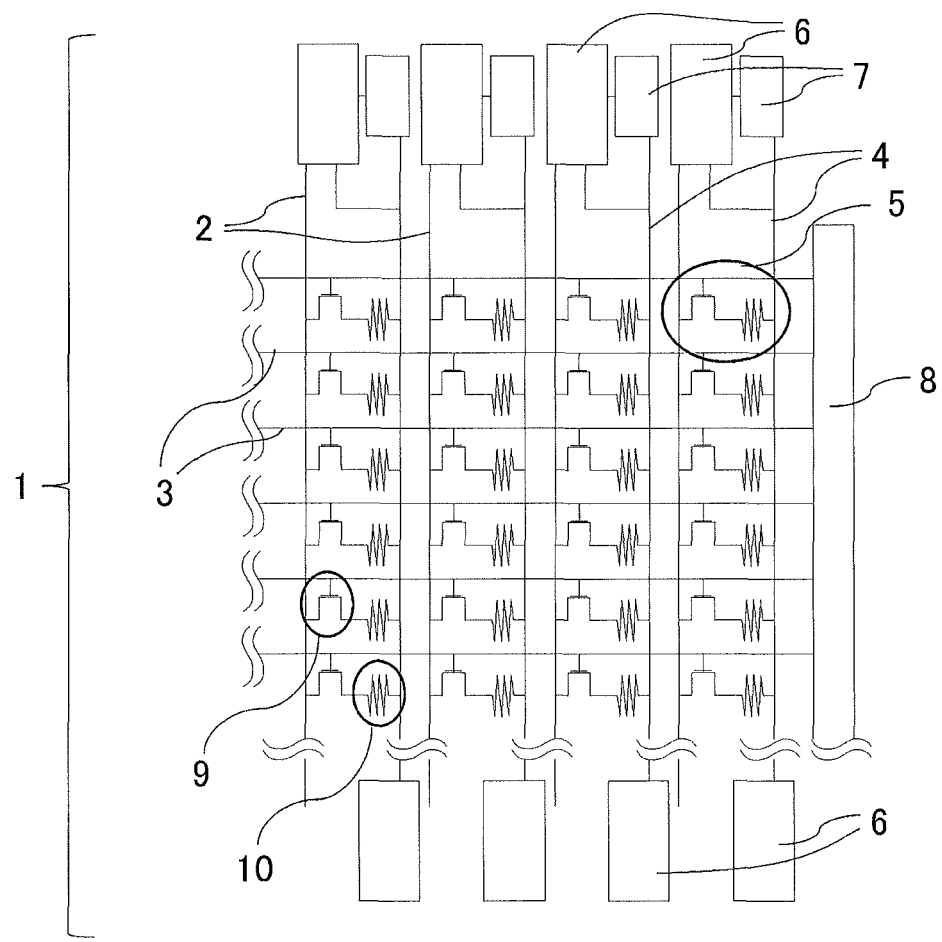
FIG. 13 is a circuit block diagram showing a magnetic memory according to the embodiment of this invention.
Figure 14:
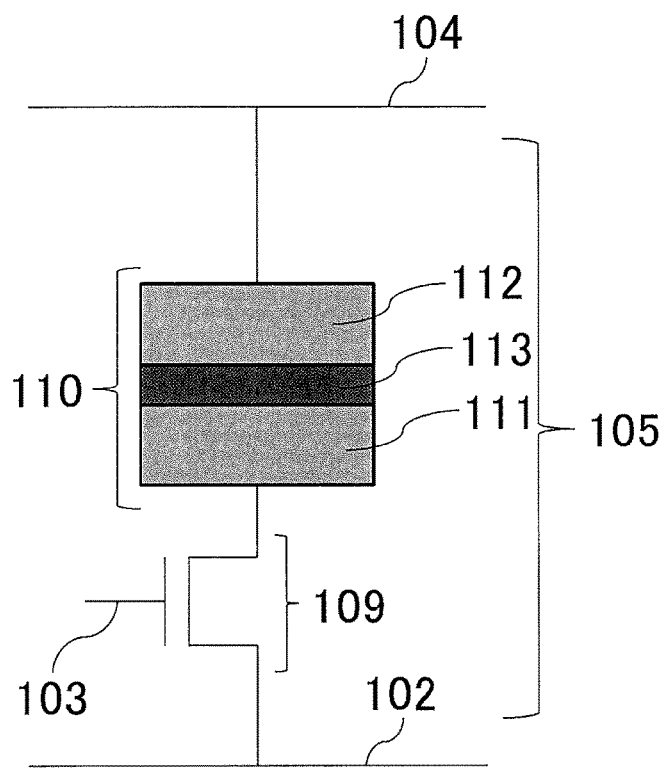
FIG. 14 is a circuit diagram showing a magnetic memory cell of a magnetic memory having a conventional magnetoresistance effect element.
Figure 15:
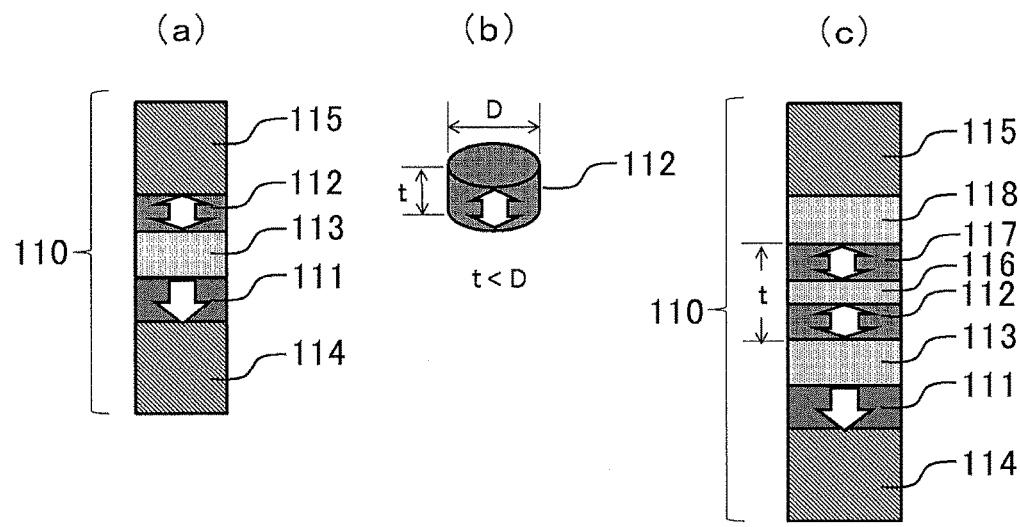
FIG. 15(a) is a longitudinal sectional view showing a conventional perpendicular magnetic anisotropy magnetoresistance effect element.
FIG. 15(b) is a perspective view of a second ferromagnetic layer.
FIG. 15(c) is a longitudinal sectional view showing a different conventional perpendicular magnetic anisotropy magnetoresistance effect element.

FIG. 13 shows a magnetic memory (MRAM) according to the embodiment of this invention.

As shown in FIG. 13, a magnetic memory 1 includes a plurality of source lines 2, a plurality of word lines 3, a plurality of bit lines 4, and a plurality of memory cells 5.

All the source lines 2 are disposed parallel to each other. All the word lines 3 are disposed parallel to each other in a direction perpendicularly crossing all the source lines 2. All the bit lines 4 are disposed parallel to each other and parallel to all the source lines 2. All the source lines 2 and all the bit lines 4 are disposed parallel to each other and juxtaposed alternately in the transverse direction. One end of each source line 2 and one end of each bit line 4 are electrically connected to a write driver 6 for voltage application and a sense amplifier 7. One end of each word line 3 is electrically connected to a word driver 8.

Each memory cell 5 is disposed at a point of intersection between each bit line 4 and each word line 3. Each memory cell 5 includes a selection transistor 9 and a magnetoresistance effect element 10. The selection transistor 9 includes a gate electrode electrically connected to the word line 3 and a source electrode electrically connected to the source line 2 through an interconnect layer. In the magnetoresistance effect element 10, one of the first and second magnetic layers 11 and 12 is electrically connected to a drain electrode of the selection transistor 9 through the lower non-magnetic electrode 14 or the upper non-magnetic electrode 15. The other of the first and second magnetic layers 11 and is electrically connected to the bit line 4. The magnetoresistance effect element 10 is formed of either of the magnetoresistance effect elements 10 shown in FIGS. 2 and 3 or any one of the magnetoresistance effect elements 10 shown in FIGS. 5 to 12. The magnetic memory 1 is configured in a manner that allows application a current to the magnetoresistance effect element 10 in a thickness direction.

Action is Described Next.

During behavior of writing "1", the write driver 6 applies a voltage to the source line 2 and the word driver 8 applies a voltage to the word line 3, thereby causing a current to flow from the source line 2 to the bit line 4 through the magnetoresistance effect element 10. At this time, in the magnetoresistance effect element 10, the magnetization direction of the second magnetic layer 12 as a recording layer of a variable magnetization direction and that of the first magnetic layer 11 as a reference layer of a fixed magnetization direction are antiparallel. This places the magnetoresistance effect element 10 in a high-resistance condition. Thus, information retained in the magnetoresistance effect element 10 becomes "1".

During behavior of writing "0", the write driver 6 applies a voltage to the bit line 4 and the word driver 8 applies a voltage to the word line 3, thereby causing a current to flow from the bit line 4 to the source line 2 through the magnetoresistance effect element 10. At this time, in the magnetoresistance effect element 10, the magnetization direction of the second magnetic layer 12 as the recording layer of a variable magnetization direction and that of the first magnetic layer 11 as the reference layer of a fixed magnetization direction are parallel. This places the magnetoresistance effect element 10 in a low-resistance condition. Thus, information retained in the magnetoresistance effect element 10 becomes "0".

When the sense amplifier 7 is reading, a signal difference resulting from resistance change is read. Using the aforementioned memory array can achieve an MRAM including the magnetoresistance effect element 10 featuring a high magnetoresistance change ratio, a low writing current, and higher thermal stability than a conventional structure.

REFERENCE SIGNS LIST

1 Magnetic memory
2 Source line
3 Word line
4 Bit line
5 Memory cell
6 Write driver
7 Sense amplifier
8 Word driver 9 Selection transistor
10 Magnetoresistance effect element
11 First magnetic layer
   21 First magnetic layer
   22 Second magnetic layer
   23 Non-magnetic layer
12 Second magnetic layer
   24 First magnetic layer
   25 Non-magnetic layer
   26 Second magnetic layer
   31 Lower magnetic layer
   32 Upper magnetic layer
   33 Lower magnetic layer
   34 Intermediate magnetic layer
   35 Upper magnetic layer
13 First non-magnetic layer
14 Lower non-magnetic electrode
15 Upper non-magnetic electrode
16 Third magnetic layer
17 Second non-magnetic layer
18 Third non-magnetic layer
19 Fourth magnetic layer
41 Insulating layer
42 Electric field application means

The invention claimed is:

1. A magnetoresistance effect element comprising a first magnetic layer of a fixed magnetization direction that is either an upward direction or a downward direction in a thickness direction, a second magnetic layer of a variable magnetization direction that can be varied upwardly or downwardly in a thickness direction, and a first non-magnetic layer disposed between the first and second magnetic layers in a thickness direction of the first and second magnetic layers, wherein the second magnetic layer has the following relationship between D (nm) and t (nm):

$$D<0.9t+13,$$

where D is a junction size corresponding to the length of a longest straight line on an end surface perpendicular to the thickness direction, and t is its layer thickness.

2. The magnetoresistance effect element according to claim 1, wherein the first magnetic layer has also the following relationship:

$$D<0.9t+13.$$

3. The magnetoresistance effect element according to claim 1, wherein the second magnetic layers or the first and second magnetic layers having the relationship of D<0.9t+13 have the junction size of 30 nm or less.

4. The magnetoresistance effect element according to claim 1, wherein the first magnetic layer has an antiparallel coupling stacked structure where two magnetic layers are coupled through a non-magnetic layer in such a manner that the respective magnetizations of the two magnetic layers become antiparallel to each other.

5. The magnetoresistance effect element according to claim 1, comprising:

a third magnetic layer of a fixed magnetization direction disposed between the first magnetic layer and the first non-magnetic layer; and a second non-magnetic layer disposed between the first and third magnetic layers.

6. The magnetoresistance effect element according to claim 1, wherein the second magnetic layer includes a plurality of magnetic layers made of materials differing from each other.

7. The magnetoresistance effect element according to claim 1 comprising electric field application means provided in a manner that allows application of an electric field to a side surface of the second magnetic layer in the thickness direction.

8. A magnetic memory comprising:

a plurality of source lines disposed parallel to each other;

a plurality of word lines disposed parallel to each other in a direction crossing the source lines;

a plurality of bit lines disposed parallel to the source lines;

a selection transistor having a gate electrode electrically connected to the word line and a source electrode electrically connected to the source line; and the magnetoresistance effect element as recited in claim 1 the magnetoresistance effect element being disposed at a point where the bit line and the word line cross each other, wherein in the magnetoresistance effect element, one of the first and second magnetic layers is electrically connected to a drain electrode of the selection transistor and the other of the first and second magnetic layers is electrically connected to the bit line, and the magnetic memory is configured in a manner that allows application of a current to the magnetoresistance effect element in the thickness direction.

9. A magnetoresistance effect element comprising a first magnetic layer of a fixed magnetization direction that is either an upward direction or a downward direction in a thickness direction, a second magnetic layer of a variable magnetization direction that can be varied upwardly or downwardly in a thickness direction, and a first non-magnetic layer disposed between the first and second magnetic layers in a thickness direction of the first and second magnetic layers, wherein at least one of the first and second magnetic layers has the following relationship between D (nm) and t (nm):

$$D<t,$$

where D is a junction size corresponding to the length of a longest straight line on an end surface perpendicular to the thickness direction, and t is its layer thickness.

10. The magnetoresistance effect element according to claim 9, wherein the first and/or second magnetic layers having the relationship of D<t has the junction size of 30 nm or less.

* * * * *

UNITED STATES PATENT AND TRADEMARK OFFICE
CERTIFICATE OF CORRECTION

PATENT NO. : 9,577,182 B2
APPLICATION NO. : 15/029860
DATED : February 21, 2017
INVENTOR(S) : Shoji Ikeda et al.

Page 1 of 1

It is certified that error appears in the above-identified patent and that said Letters Patent is hereby corrected as shown below:

In the Specification

Column 6 Line 65, change "Ri" to "Ru";

Column 10 Line 44, change "Ri" to "Ru";

Column 12 Line 45, change "Ri" to "Ru"; and

Column 13 Line 41, change "Ri" to "Ru".

Signed and Sealed this
Twenty-fourth Day of April, 2018

Andrei Iancu
*Director of the United States Patent and Trademark Office*